United States Patent [19]

Emery

[11] 4,356,443
[45] Oct. 26, 1982

[54] DETECTION OF ARCING FAULTS IN POLYPHASE ELECTRIC MACHINES

[75] Inventor: Franklin T. Emery, Greentree, Pa.

[73] Assignee: Westinghouse Electric Corp., Pittsburgh, Pa.

[21] Appl. No.: 181,513

[22] Filed: Aug. 26, 1980

[51] Int. Cl.³ ............................................. G01R 31/02
[52] U.S. Cl. .............................. 324/51; 324/158 MG; 324/52; 361/31
[58] Field of Search .................... 324/51, 52, 158 MG; 361/31, 28

[56] References Cited

U.S. PATENT DOCUMENTS

| | | | |
|---|---|---|---|
| 4,053,876 | 10/1977 | Taylor | 324/51 X |
| 4,096,539 | 6/1978 | Scaturro | 324/51 X |
| 4,156,846 | 5/1979 | Harrold et al. | 324/51 X |

FOREIGN PATENT DOCUMENTS 442442  12/1974  U.S.S.R. ................................ 324/51

*Primary Examiner*—Stanley T. Krawczewicz
*Attorney, Agent, or Firm*—William D. Lanyi

[57] ABSTRACT

A method is provided for detecting the existence of arcing faults in the phase windings of a polyphase electric machine and for simultaneously identifying the specific phase winding in which the arcing fault exists. Arcing faults in phase windings of electric machines cause high frequency currents to flow through all phase windings of the machine with a drastically higher magnitude in the phase winding in which the arcing fault exists. These currents can thus be measured to determine the existence of the arcing fault and selectively determine which phase is affected.

11 Claims, 4 Drawing Figures

DETECTION OF ARCING FAULTS IN POLYPHASE ELECTRIC MACHINES

BACKGROUND OF THE INVENTION

The present invention relates to the detection of arcing faults in the phase windings of polyphase electric machines and, more particularly, the selective determination of the phase winding which is exhibiting the detected arcing fault.

In electric machinery, arcing faults are early indications of either turn-to-turn insulation failures or actual broken conductors caused by fatigue failure and precursors of more costly catastrophic failures. Such arcs are caused by the intermittent contact between adjacent turns resulting from insulation failure or by the variation of the small gap that occurs between the formerly integral parts of a broken conductor. Such arcs are not continuous, but are regularly interrupted and reignited because of the movement of the conductor surfaces between which the arcing occurs. Further interruptions occur because, due to the alternating nature of the current, the arc is extinguished at each zero crossing of the 60 Hz current. This interruption and reignition of the arcs cause pulses of short duration containing radio frequency components to flow in the conductors connected to the phase winding in which the arcing is occurring.

Detection methods that utilize the radio frequency generation attribute of arcing faults are widely known. One such method involves the detecting of radio frequency currents in the grounded neutral lead of large dynamoelectric machines, such as turbine generators. Such a method is disclosed in U.S. Pat. No. 4,156,846 of R. T. Harrold et al., issued May 29, 1979. Arcing detection methods of this type, detecting the existence of radio frequency currents, allow early discovery of the arcing faults and avoidance of the more serious and perhaps catastrophic damage that would occur if the arcing condition is ignored.

However, even with early detection the electric machine must undergo a costly and time consuming repair effort much of which consists of locating the specific phase in which the arcing has occurred. Heretofore, it was not possible to easily determine and identify the particular phase winding in which the source of the arcing was located. In an electric machine with windings the ability to selectively determine the phase winding which is affected by arcing can avoid up to two thirds of the effort presently required in locating the precise location of the arcing fault. Furthermore, the above-mentioned Harrold invention is only applicable in machines that have the neutral point grounded.

SUMMARY OF THE INVENTION

The present invention provides an apparatus that facilitates the detection of an arcing fault as soon as it commences, at a time when prompt repair can avoid serious damage to the equipment affected. More importantly, the affected phase is identified simultaneously with the detection of the arcing condition and there is no requirement that the neutral point be grounded. The arcing involved in this type of fault is erratically interrupted and reignited at a high frequency both because of the alternating nature of the normal machine current and also because of the motion of the adjacent turns or the broken ends involved. The result of these high-frequency pulses is the production of high-frequency currents in the conductors that connect the affected phase winding with the power source and the neutral connection, namely the main and neutral leads of the affected phase winding. By monitoring the high-frequency currents flowing in the main and neutral leads of each phase winding separately, a distinction can be made among the magnitudes of the high-frequency currents flowing in the phase windings. Although an arcing fault will generate some high-frequency current in all phases of the polyphase electric machine, the most significant effect will be seen in the magnitude of the high frequency current in the phase winding that is arcing. The currents in each phase can be monitored for high frequency components and these components can be quantified for comparison to either a predetermined threshold value or to each other to determine the phase in which the arcing fault exists. With this apparatus, the arcing fault can be detected at an early stage before overheating and serious damage can occur and, more importantly, the affected phase can be identified so that discovery and repair can be performed more quickly and at lower cost.

BRIEF DESCRIPTION OF THE DRAWINGS

The invention will be more fully understood from the following detailed description of the preferred embodiment, read in conjunction with the accompanying drawings, in which.

DESCRIPTION OF THE PREFERRED EMBODIMENT

Figure 1:
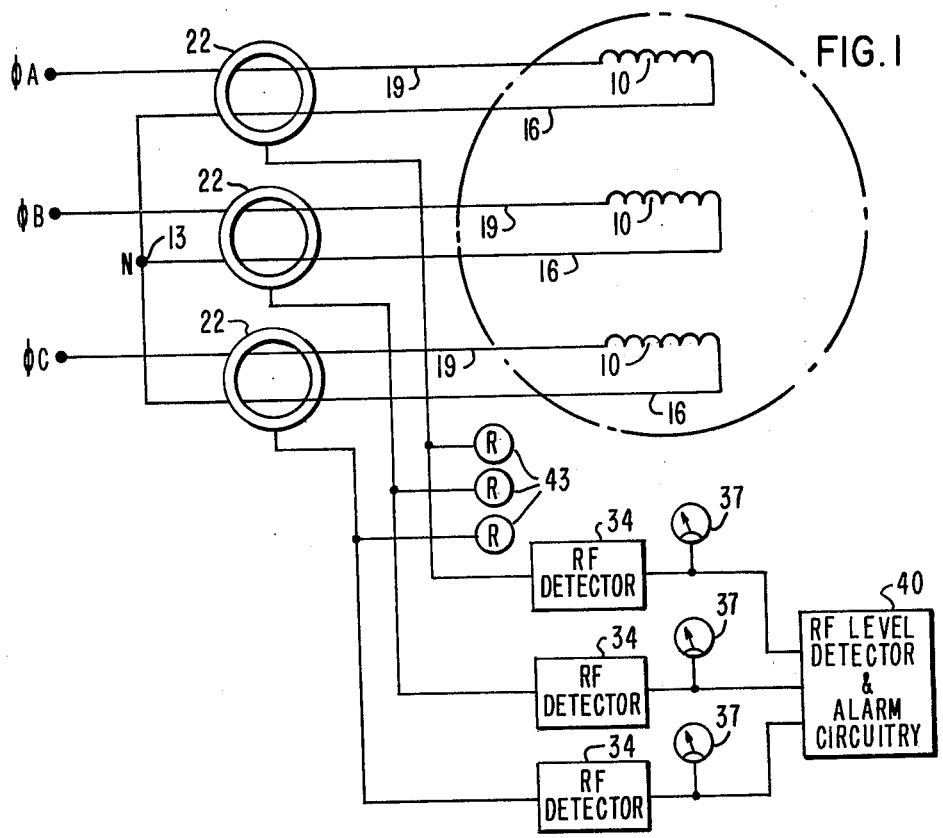
FIG. 1 is a schematic of a polyphase electric machine with the invention applied in a flux balancing manner.

The present invention will selectively determine the existence of an arcing fault in any phase winding of a polyphase electric machine. For purposes of illustration the invention is described herein as it is applied to detecting arcing faults in polyphase electric motors. A schematic of this type of application is shown in FIG. 1. Motors of this type have three phase windings 10, each connected to a neutral point 13 by a neutral lead 16 and connected to a power source by a main lead 19. A high-frequency current transformer 22 is disposed about the main and neutral lead pair of each phase winding in such a way that normal operational current simultaneously passes through the current transformers in both directions with equal magnitude, thus producing no net inductive effect on the current transformers 22 and no proportionate current signal in the output of the current transformers 22. This flux balancing scheme of placement of the current transformers, although not an absolute operating requirement, also prevents saturation of the current transformers' solid cores when operating at currents above their saturation levels since, under normal conditions, the line current flux will be cancelled.

Figure 2:
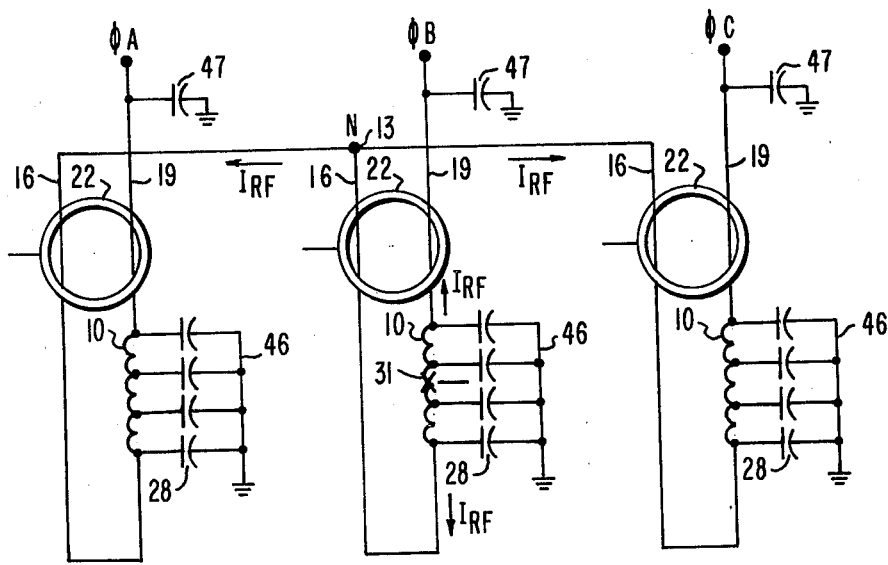
FIG. 2 is a schematic of a polyphase electric machine shown with a supposed arcing fault and the probable path of the high-frequency currents resulting from that fault.

This flux balancing scheme will not work to cancel the radio frequency currents $I_{RF}$ that result from an arcing fault because, as shown in FIG. 2, the high frequency currents $I_{RF}$ emanate in all possible conductive paths including the phase windings' distributed capacitance 28. The high-frequency currents $I_{RF}$ are shown emanating from the area of a supposed arcing fault 31 in phase B of the three-phase motor shown schematically in FIG. 2. As can be seen, the high-frequency currents $I_{RF}$ must flow in identical directions as they pass through the high-frequency transformer associated with the phase winding in which the arcing fault occurs. As this high-frequency current proceeds through the other phase windings and their associated high-frequency current transformers, it tends to flow through the current transformers in opposite directions simultaneously. This creates only highly attenuated effects in the high frequency current transformers in the non-arcing phase windings because the only net current flowing through the current transformers is due to the fact that a portion of the radio frequency current flowing through the current transformer toward the non-arcing phase winding is dissipated through the distributed capacitance of the non-arcing phase winding and therefore does not pass through the current transformer in a direction away from the non-arcing phase winding. Therefore when arcing 31 exists in one phase winding, a relatively strong signal will be induced in its associated high frequency current transformer and highly attenuated signals will be induced in the high-frequency current transformers associated with the non-arcing phase windings. Also shown in FIG. 2 are the distributed capacitances 28 between the phase windings 10 and the core 46 and the motor's external circuit capacitance 47.

Figure 3:
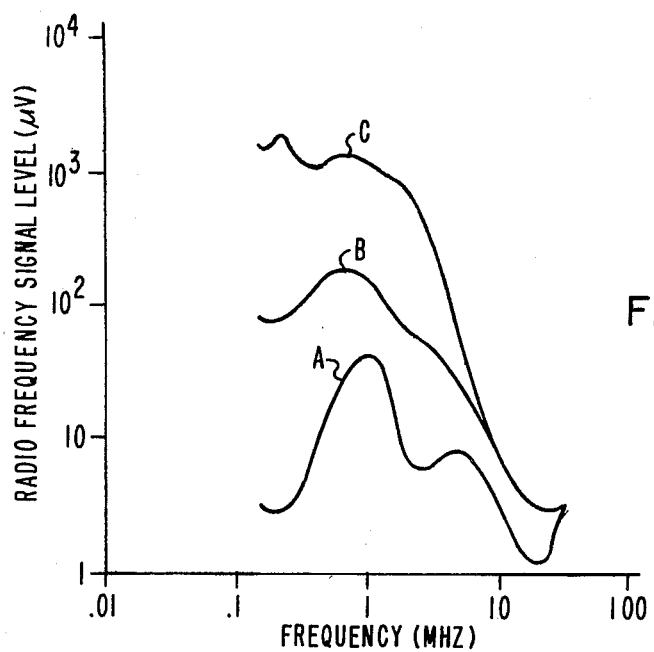
FIG. 3 is a set of curves showing the high frequency distributions measured in two phases of a motor with no arcing A, the high-frequency distribution in the non-arcing phase B when arcing existed in another phase, and the high-frequency distribution in the phase in which arcing existed C.

FIG. 3 shows the results of a simulation of an arcing fault in one phase of a 500 KVA motor specially constructed with the top coil of one its phase windings having the first five of its nine turns brought out to a terminal board. To simulate the arcing fault in this phase winding, a battery operated relay with a set of contacts opening and closing at a frequency of 200 Hz was connected in series with a current limiting resistor of 1.6 ohms between two adjacent coil turns of the specially constructed phase winding. With the motor running and with an applied voltage of 2300 volts line to line, a potential of 8 volts RMS existed across the first turn. The 1.6 ohm limiting resistor was chosen so that the turn short circuit current would be limited to 5 amperes. With the motor running at a no load rated speed of 1200 RPM and without simulated arcing, a radio frequency spectrum from 150 KHz to 30 Mhz was measured for both the specially constructed phase and one other phase. With no arcing occurring, both phases exhibited a frequency profile as shown in curve A of FIG. 3. With the arcing fault simulator connected and operating as described above, the spectra were again measured for the same two phase windings. Curve B shows the frequency profile for the non-arcing phase and curve C shows the frequency profile for the phase in which the arcing fault simulator existed. As can be seen from the above description read in conjunction with FIG. 3, with no arcing the frequency profiles of the phase windings indicate only normal radio frequency background levels. However when arcing occurs there is a readily perceptible rise in the radio frequency levels in all phases and a dramatic rise in the radio frequency level in the phase in which the arcing occurs.

Again referring to FIG. 1, the present invention is shown connected in a way to take advantage of the phenomena described above. The high-frequency current transformers 22, with a frequency response from 60 Hz to 10 MHz, are disposed about each phase's main and neutral leads in a flux balancing scheme. The output of each current transformer, which is a signal proportionate to the radio frequency current flowing through its primary, is connected to the input of a radio frequency detector 34 which converts the radio frequency signal to a direct-current voltage which in turn is measured by a direct-current voltmeter 37 or, in the alternative, a strip chart recorder if a permanent record is needed. The direct-current voltage that is measured by the direct-current voltmeter can also be connected to circuitry 40 that detects an increase in the radio frequency levels indicated by one or all of the direct-current voltage levels described above and activates an alarm if this condition is detected. The phase winding with the highest radio frequency current level can be detected by this circuitry and an appropriate signal can inform the operator which phase winding is arcing. In order to prevent false alarm activation caused by spurious line transients a time delay can be included in the alarm circuitry.

Since the high frequency current transformers described above respond to the power line frequency, they can also be connected to ground fault relays 43 without requiring additional current transformers. Of course this additional capability exists only if the present invention is applied in the flux balancing mode described above.

Figure 4:
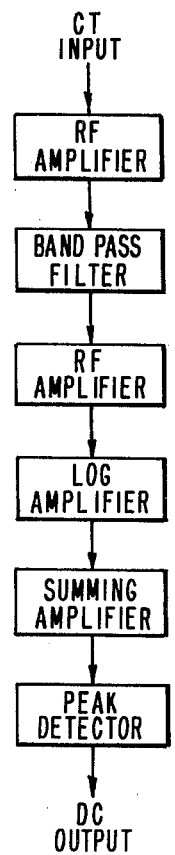
FIG. 4 is a schematic of a typical radio frequency detector.

The radio frequency detector 34 of FIG. 1 can be of various types. FIG. 4 shows an example of one type of radio frequency detector that can be used in conjunction with the present invention as described above.

It is apparent from the above discussion and drawings that the present invention makes it possible to selectively detect arcing faults in polyphase electric machines and correctly identify the involved phase in a reliable and accurate way and in a relatively inexpensive manner. It should also be apparent that, although a polyphase electric motor was specifically used in the discussion above, the present invention could also be applied to other types of polyphase electric machines in a manner that will facilitate the early detection and location of arcing faults at an early enough stage to allow repair before any serious damage has occurred to the machine.

What is claimed is:

1. An electric machine having a polyphase winding with an arcing detector, comprising:
    a high-frequency current transformer disposed about each phase lead of said polyphase machine, said current transformer outputting a current signal proportionate to the magnitude of radio frequency current flowing in its associated phase lead;
    means connected to the output of each of said current transformers for converting said proportionate current signal to a direct-current voltage value; and
    means for individually measuring the magnitude of said direct-current voltage value for each phase winding of said polyphase electric machine.

2. The electric machine with an arcing detector of claim 1, wherein:

a radio frequency detector is the means for converting said proportionate current signal to a direct-current voltage value.

3. The electric machine with an arcing detector of claim 1, wherein:

a direct-current voltmeter is the means for measuring the magnitude of said direct-current voltage value for each phase winding of said polyphase electric machine.

4. The electric machine with an arcing detector of claim 1, further comprising:

means for determining if the measured direct-current voltage exceeds an acceptable threshold level;

an alarm connected to said determining means, said alarm being activated whenever said measured direct-current voltage exceeds said threshold; and means for preventing said alarm from being activated by spurious line transient radio frequency signals.

5. The electric machine with an arcing detector of claim 4, wherein:

said acceptable threshold level is a fixed, predetermined magnitude.

6. The electric machine with arcing detector of claim 4, wherein:

said acceptable threshold level is dynamically derived from the magnitudes of the radio frequency current levels of the other phase windings.

7. A method for selectively determining the existence of an arcing fault in one phase winding of a polyphase electric machine, said method comprising:

monitoring individually the magnitude of radio frequency current in each phase winding of said polyphase electric machine;

comparing the magnitude of said radio frequency current flowing in each of said phase windings to an acceptable threshold value in order to determine whether an arcing fault exists in the specific phase winding indicated by a radio frequency current magnitude greater than that flowing in the other phase windings of said polyphase electric machine.

8. The method in accordance with claim 7, wherein:
said acceptable threshold value is a fixed predetermined magnitude.

9. The method in accordance with claim 7, wherein:
said acceptable threshold value is dynamically derived for each phase winding as a function of the magnitudes of the other phase windings of said polyphase electric machine.

10. The method in accordance with claim 7, further comprising:

indicating an arcing fault condition with an alarm whenever said radio frequency current for one phase winding exceeds said acceptable threshold value.

11. The method in accordance with claim 10, further comprising:

preventing said arcing fault condition from being indicated upon spurious line transients by employing a time delay in the alarm circuit.

* * * * *